(12) United States Patent
Wang et al.

(10) Patent No.: US 9,947,619 B2
(45) Date of Patent: Apr. 17, 2018

(54) COUPLING STRUCTURES FOR SIGNAL COMMUNICATION AND METHOD OF MAKING SAME

(71) Applicant: Intel Corporation, Santa Clara, CA (US)

(72) Inventors: Ke Wang, Laveen, AZ (US); Xingjian Cai, Palo Alto, CA (US); Mohammad Ibrahim Khan, Tempe, AZ (US); Yun Ji, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/203,718

(22) Filed: Jul. 6, 2016

(65) Prior Publication Data

US 2018/0012834 A1 Jan. 11, 2018

(51) Int. Cl.
*H01L 23/522* (2006.01)
*H01L 23/528* (2006.01)
*H01L 49/02* (2006.01)

(52) U.S. Cl.
CPC ............ *H01L 23/528* (2013.01); *H01L 28/40* (2013.01)

(58) Field of Classification Search
CPC .......................... H01L 23/5222; H01L 23/642
See application file for complete search history.

(56) References Cited

U.S. PATENT DOCUMENTS

| 2012/0229997 A1 | 9/2012 | Su et al. |
| 2013/0228366 A1 | 9/2013 | Lam |
| 2014/0049929 A1 | 2/2014 | Yamaguchi |
| 2015/0221060 A1 | 8/2015 | Imai |
| 2017/0069601 A1* | 3/2017 | Park ................... H01L 25/0657 |

FOREIGN PATENT DOCUMENTS

| JP | 2009177072 A * | 8/2009 |
| WO | 2016072337 | 5/2016 |

OTHER PUBLICATIONS

PCT Application No. PCT/US2017/032941, International Search Report and the Written Opinion, dated Jul. 24, 2017, 16 pgs.

* cited by examiner

*Primary Examiner* — Jae Lee
(74) *Attorney, Agent, or Firm* — Womble Bond Dickinson (US) LLP (57) ABSTRACT

Techniques and mechanism to provide signal communication with vias variously extending in a substrate. In an embodiment, a first capacitor and a second capacitor are coupled in parallel with one another each between a first via and a second via, the first via to receive a first signal. Respective portions of the first signal are concurrently communicated from the first via to the second via with the first capacitor and the second capacitor, respectively. In another embodiment, the first signal is one signal of a differential signal pair further comprising a second signal which is received at a third via. Respective portions of the second signal are concurrently communicated from the third via to a fourth via with a third capacitor and a fourth capacitor, respectively. The third capacitor and the fourth capacitor are coupled in parallel with one another each between the third via and the fourth via.

15 Claims, 7 Drawing Sheets

COUPLING STRUCTURES FOR SIGNAL COMMUNICATION AND METHOD OF MAKING SAME

BACKGROUND

1. Technical Field

The invention relates generally to signal communication links and, more particularly, to methods and apparatus to provide coupling for communication of a differential signal pair.

2. Background Art

Differential signal transmission, in general, is a known method of transmitting information electrically from a transmitting device (or transmitter) to a receiving device (or receiver), by means of two complementary signals sent on two separate traces in which the receiver recovers the information based on the difference between the two complementary signals. In general, the receiver ignores the traces' voltages with respect to ground, therefore, small changes in ground potential between transmitter and receiver do not affect the receiver's ability to detect the signal. Therefore, better tolerance of ground offsets, low switching noise and better noise immunity under low voltage levels may be achieved with differential transmission. The technique has been used in both analog signaling, as in some audio systems, and digital signaling, as in high-speed serial I/O interfaces.

In modern communication system, many technologies are approaching and exceeding 10 Gigabits per second (Gbps) data rates. As a result, high-speed input-output (IO) differential channel performance is increasingly critical for an acceptable excessive bit error rate (BER). As high-speed signaling technologies continue to proliferate at increased data rates, there is expected to be a greater premium placed on incremental improvements in the communication of differential signals.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide alternating current (AC) coupling to mitigate loss of integrity in signal communications. Interconnect structures may communicate at least a first signal and, in some embodiments, a concurrent second signal that is complementary to the first signal. The first signal may be provided to one via that extends in a substrate (such as that of a printed circuit board), wherein the one via is coupled to another via in the substrate by capacitors that are configured in parallel with each other. Certain features of various embodiments are described herein with reference to interconnect structures for communicating a differential signal pair. However, such description may be extended to additionally or alternatively pertain to interconnect structures for communication of a single-ended signal.

In an embodiment, multiple via pairs each include respective vias that are coupled to one another by an in-parallel configuration of capacitors. For example, a first via and the second via may be coupled, respectively, to a third via and fourth via that also extend in the substrate. The third via may be coupled to receive a version of the first signal from the first via, wherein the fourth via is coupled to receive a version of the second signal from the second via. For example, a first capacitor and a second capacitor may be coupled in parallel with one another between the first via and the third via. Similarly, a third capacitor and a fourth capacitor may be coupled in parallel with one another between the second via and the fourth via. For a given one (e.g., each) of the first via and the third via, different respective locations along a length of that via may function as connection points for variously coupling the via to the first capacitor and the second capacitor. Alternatively or in addition, for a given one (e.g., each) of the second via and the fourth via, different respective locations along a length of that via may function as connection points for variously coupling the via to the second capacitor and the fourth capacitor.

Some embodiments are based on a realization by the inventors that a portion of a via—e.g., a portion which extends past a point of connection of that via (that is, a point of direct or indirect connection) to an AC coupling capacitor—can be a source of signal noise. In providing multiple paths for coupling a via to an AC coupling capacitor—e.g., where such paths variously extend from different respective levels of that via—embodiments variously reduce the relative proportion of extraneous end structures of a via. As a result, some embodiments mitigate signal noise that might otherwise be created by such extraneous end structures.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a substrate having formed therein or thereon vias and capacitors configured to provide AC coupling for the communication of a differential signal pair.

Figure 1:
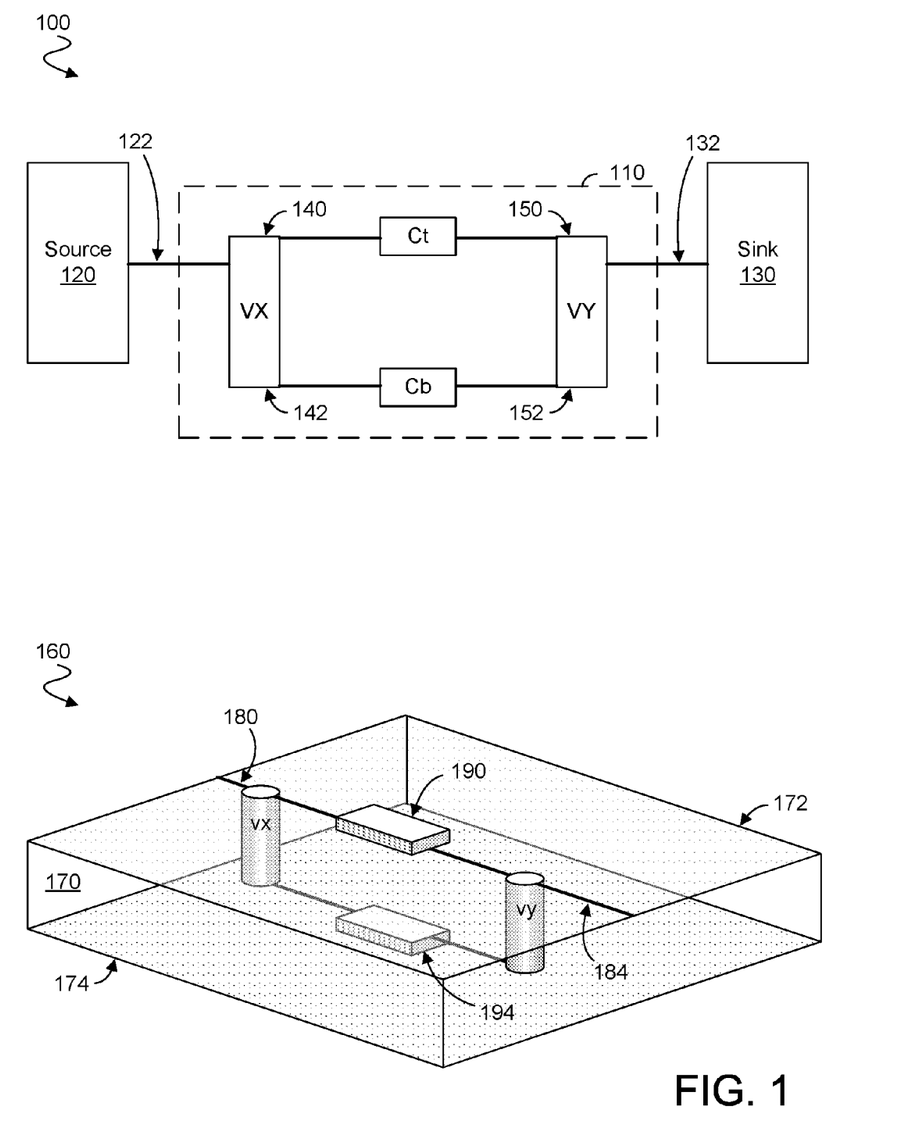
FIG. 1 shows a functional block diagram and perspective view illustrating elements of a system to provide a signal communication according to an embodiment.

FIG. 1 illustrates elements of a system 100 to provide a signal—e.g., of a single-ended communication or a differential communication—according to an embodiment. A substrate 110 of system 100 may include or couple to circuitry (such as the illustrative source 120 shown) to provide a differential communication. Alternatively or in addition, system 100 may include or couple to second circuitry (such as the illustrative sink 130 shown) to receive such differential communication, at least in part. Substrate 110 may include printed circuit board, an interposer or other such structure to facilitate communication between microelectronic devices (e.g., including one or more integrated circuit dies) or other such circuit components.

In the illustrative embodiment shown, vias VX, VY variously extend in substrate 110 and are coupled to communicate a signal from source 120 to sink 130. For example, a signal line 122 in or on substrate 110 may be coupled to provide a single-ended communication (or alternatively, one signal of a differential signal pair) to VX. In an embodiment, VX is coupled to provide a corresponding portion of such a signals to VY. In turn, signal lines 132 may provide a respective signal portion to sink 130 from VY.

To mitigate degradation of signal integrity, system 100 may include capacitors variously coupled, in or on substrate 110, each between via pair VX, VY. A location 140 of VX may provide a point of direct or indirect coupling to a capacitor Ct, where another location 142 of VX provides another point of coupling to capacitor Cb. Alternatively or in addition, locations 150, 152 of VY may provide various points of coupling—e.g., directly or indirectly—to Ct and Cb, respectively.

Locations 140, 142 may be at different respective levels of substrate 110, for example. By way of illustration and not limitation, one of locations 140, 142 may be at one end of VX and/or at a side (e.g., and exterior surface) of substrate 110. Alternatively or in addition, the other of locations 140, 142 may be at an opposite end of VX and/or an opposite side of substrate 110. Similarly, locations 150 and 152 may be at different respective levels of substrate 110. In an embodiment, some or all of locations 140, 142, 150, 152 are other than any location at an end of a via.

Although some embodiments are not limited in this regard, locations 140, 150 may be at a same horizontal plane (for brevity, "level") of substrate 110—e.g., where locations 142, 152 are each at a different level of substrate 110. Via VX may be coupled to signal line 122 at a level including location 140 and at a level including location 142 or at some other level of substrate 110. Alternatively or in addition, via VY may be coupled to signal line 132 at a level of substrate 110 which includes location 150, at a level which includes 152, or at some other level of substrate 110.

FIG. 1 also shows a perspective view of system 160 to communicate a differential signal pair according to an embodiment. System 160 may include some or all features of system 100, for example. By way of illustration and not limitation, system 160 may include substrate 170 which, for example, corresponds functionally to substrate 110. System 160 may have formed therein or thereon vias vx, vy corresponding, for example, to VX, VY. System 160 may further comprise signal lines 180, 184 corresponding functionally to signal lines 122, 132, respectively. In the illustrative embodiment shown, side 172 of substrate 170 has formed therein or thereon signal lines 180, 184 each coupled to a respective location (e.g., respective end portions) of vx, vy. An opposite side 174 of substrate 170 may have formed therein or thereon respective second locations of vx, vy. A capacitors 190 may be disposed in or on side 172, wherein capacitor 190 is coupled between respective first locations of vx and vy. Another capacitor 194 may be disposed in or on side 174, wherein capacitor 194 is coupled between respective second locations of vx and vy.

Figure 2:
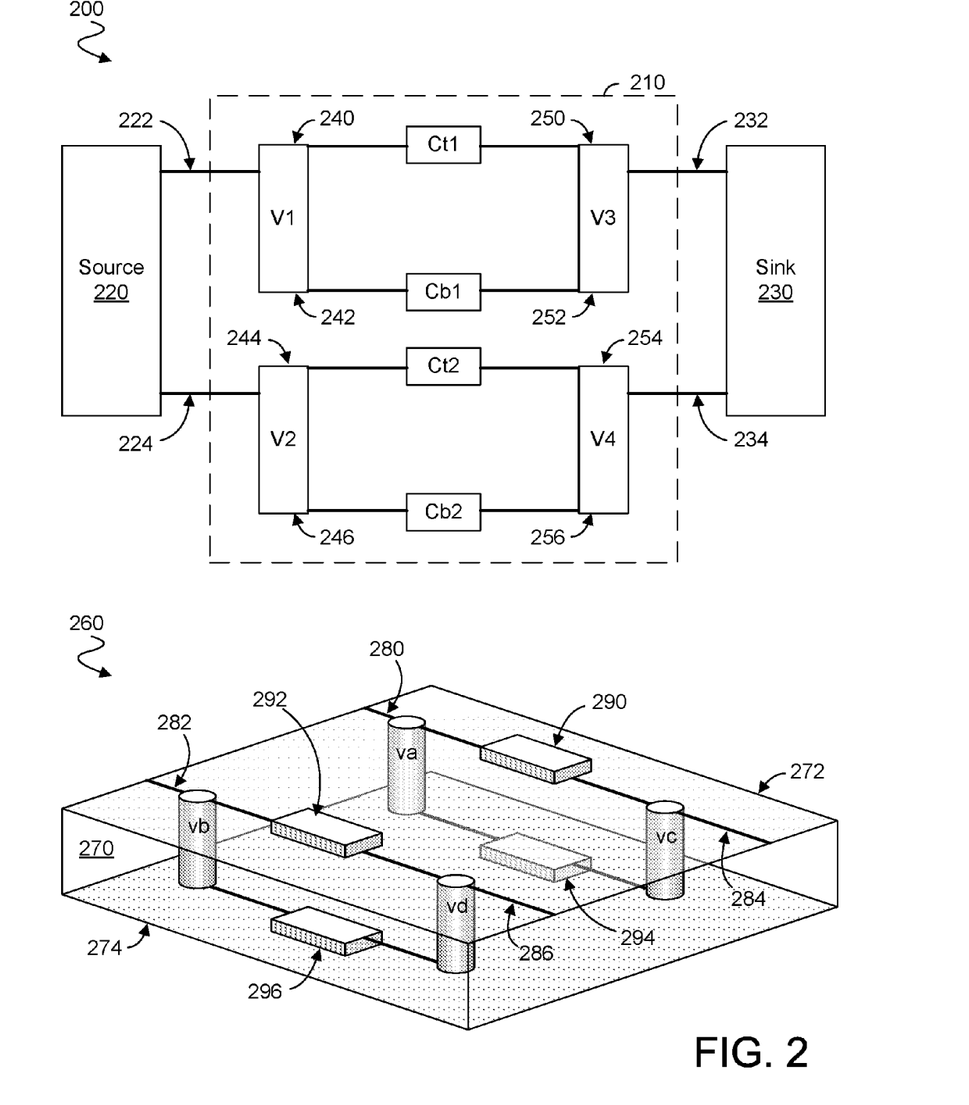
FIG. 2 shows a functional block diagram and perspective view illustrating elements of a system to provide a differential signal communication according to an embodiment.

FIG. 2 illustrates elements of a system 200 to communication a differential signal pair according to an embodiment. A substrate 210 of system 200 may include or couple to circuitry (such as the illustrative source 220 shown) to provide a differential communication. Alternatively or in addition, system 200 may include or couple to second circuitry (such as the illustrative sink 230 shown) to receive such differential communication, at least in part. Substrate 210 may include an electrically insulated material and interconnect layers formed therein. Substrate 210 may be configured to interconnect integrated circuitry that, for example, is on different respective integrated circuit dies of a packaged device or, alternatively, in different packaged devices. For example, substrate 210 may be a printed circuit board, an interposer or other such structure.

In the illustrative embodiment shown, vias V1, V2, V3, V4 variously extend in substrate 210 and are coupled to communicate differential signaling from source 220 to sink 230. For example, signal lines 222, 224 in or on substrate 210 may be coupled to provide respective signals of a differential signal pair to V1 and V2, respectively. In an embodiment, V1 and V2 are coupled each to provide a corresponding portion of such signals to V3 and V4, respectively. In turn, signal lines 232, 234 may provide respective signal portions to sink 230 from V3 and V4, respectively.

To mitigate degradation of signal integrity, system 200 may include capacitors variously coupled, in or on substrate 210, each between a respective one of via pair V1, V3 and via pair V2, V4. Vias V1, V2 may be variously coupled to capacitor Ct1 each by respective locations 240, 250 and to capacitor Cb1 each by respective locations 242, 252. Vias V2, V4 may be variously coupled to capacitor Ct2 each by respective locations 244, 254 and to capacitor Cb2 each by respective locations 246, 256. Locations 240, 242 may be at different respective levels of substrate 210, for example. By way of illustration and not limitation, one of locations 240, 242 may be at one end of V1 and/or at a side (e.g., and exterior surface) of substrate 210. Alternatively or in addition, the other of locations 240, 242 may be at an opposite end of V1 and/or an opposite side of substrate 210. Similarly, locations 250 and 252 may be at different respective levels of substrate 210—e.g., wherein locations 244, 246 are at different respective levels of substrate 210 and/or locations 254, 256 are at different respective levels of substrate 210. In an embodiment, some or all of locations 240, 242, 244, 246, 250, 252, 254, 256 are other than any location at an end of a via (also variously referred to herein as a "via end portion" or "end portion").

Although some embodiments are not limited in this regard, locations 240, 250 may be at a same horizontal plane (for brevity, "level") of substrate 210—e.g., where location 244 and/or location 254 are also at that same level. In such an embodiment, locations 242, 252 may be each at a different level of substrate 210—e.g., where location 246 and/or location 256 are also at that same different level. Via V1 may be coupled to signal line 222 at a level including location 240 and at a level including location 242 or at some other level of substrate 210. Alternatively or in addition, V2 may be coupled to signal line 224 at a level including 244, at a level including location 242 or at some other level of substrate 210. Via V3 may be coupled to signal line 232 at a level of substrate 210 which includes location 250, at a level which includes 252, or at some other level of substrate 210. V4 may be coupled to signal line 234 at a level which includes location 254, at a level which includes location 256 or at some other level of substrate 210.

FIG. 2 also shows a perspective view of system 260 to communicate a differential signal pair according to an embodiment. System 260 may include some or all features of system 200, for example. By way of illustration and not limitation, system 260 may include substrate 270 which, for example, corresponds functionally to substrate 210. System 260 may have formed therein or thereon vias va, vb, vc, vd corresponding, for example, to V1, V2, V3, V4. System 260 may further comprise signal lines 280, 282, 284 and 286 corresponding functionally to signal lines 222, 224, 232 and 234, respectively. In the illustrative embodiment shown, side 272 of substrate 270 has formed therein or thereon signal lines 280, 282, 284 and 286 each coupled to a respective location (e.g., respective end portions) of va, vb, vc, vd. An opposite side 274 of substrate 270 may have formed therein or thereon respective second locations of va, vb, vc, vd. Capacitors 290, 292 may be variously disposed on side 272—wherein capacitor 290 is coupled between first locations of va and vc and/or wherein capacitor 292 is coupled between respective first locations of vb and vd. Alternatively or in addition, capacitors 294, 296 may be variously disposed in or on side 274—wherein capacitor 294 is coupled between respective second locations of va and vc and/or capacitor 296 is coupled between respective second locations of vb and vd.

Figure 3:
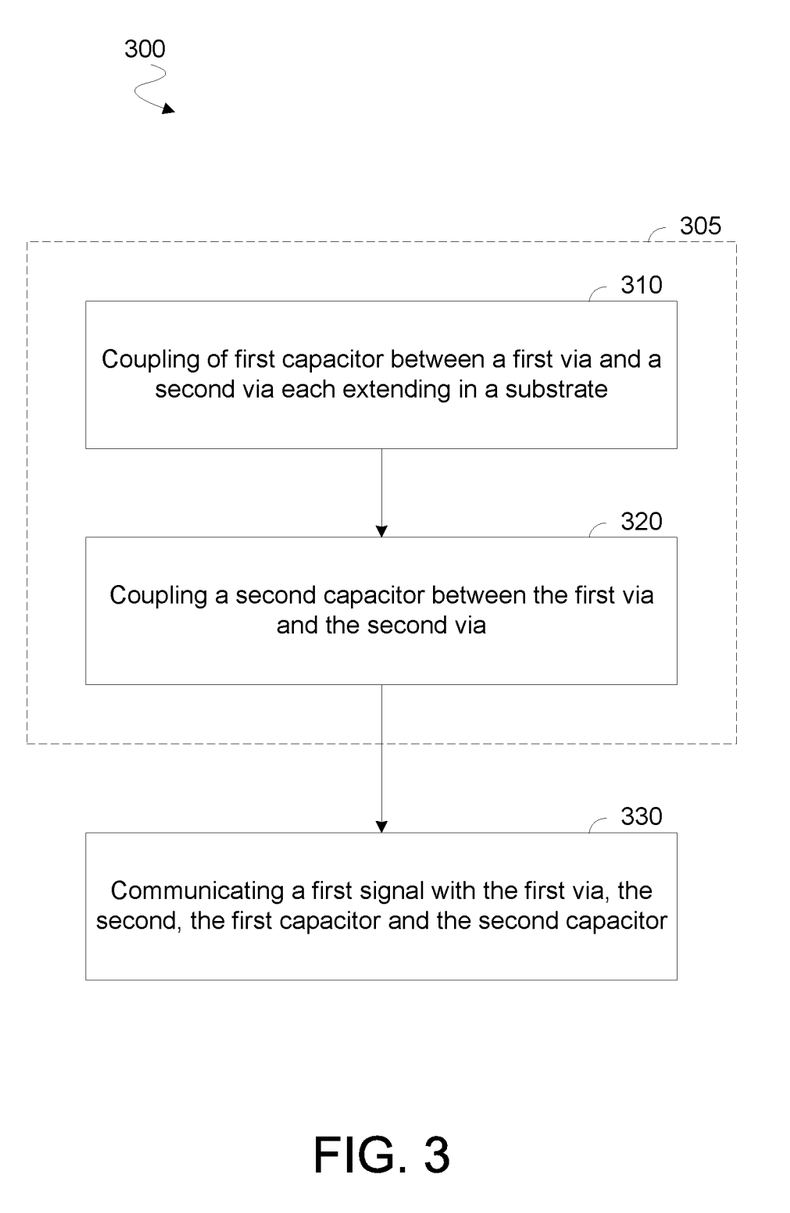
FIG. 3 is a flow diagram illustrating elements of a method to provide signal communications according to an embodiment.

FIG. 3 illustrates features of method 300 to facilitate signal communication according to an embodiment. Method 300 may provide for a communication via interconnect structures such as those of system 100, system 200 or system 260, for example. In some embodiments, 300 may include operations 305 to manufacture interconnect structures. For example, operations 305 may include at 310, coupling of a first capacitor between a first via and a second via each extending in a substrate and, at 320 coupling a second capacitor between the first via and the second via. The coupling at 310, 320 may include variously connecting capacitor Ct and capacitor Cb to each of vias VX, VY or, for example, variously connecting capacitor Ct1 and capacitor Cb1 to each of vias V1, V3.

In some embodiments, operations 305 may further comprise operations (not shown) including coupling a third capacitor between a third via and a fourth via and, further coupling a fourth capacitor between the third via and the fourth via. Such coupling of the third and fourth capacitor may include variously connecting capacitors Ct2, Cb2 each between V2 and V4, for example.

Some or all of the coupling at 310, 320 may include operations—e.g., comprising any of a variety of additive and/or subtractive processes such as lithography, etching, plating or the like—that, for example, are adapted from conventional techniques for forming patterned interconnect structures. For one or more of the first, and second vias (and in some embodiments, the above described third and fourth vias)—e.g., for each such via—different locations along the length of that via may function as connection points for variously coupling the via each to a respective capacitor. By way of illustration and not limitation, different locations (e.g., opposite ends) of one such via may include respective points of connection each to a different respective one of the first capacitor and the second capacitor (or, in some embodiments, each to a different respective one of the third capacitor and the fourth capacitor).

In some embodiments method 300 may additionally or alternatively include operation of the device such as one provided according to operations 305. For example, method 300 may further comprise at 350 communicating a first signal that, for example, is a single-ended signal pair or (alternatively) part of a differential pair which further comprises a second signal. The communicating at 350 may include communicating a portion of the first signal using the first via, the second via, the first capacitor and the second capacitor. In some embodiments (wherein the first signal is one of a differential signal pair), method 300 may further include communicating a portion of a second signal using a third via, fourth via, third capacitor and fourth capacitor. For example, the communicating at 350 may comprise receiving the first signal and the second signal at the first via and at the third via, respectively. Respective portions of the first signal, variously output by the first via, may be provided to the second via from the first capacitor and the second capacitor. Similarly, respective portions of the second signal, variously output by the third via, may be provided to the fourth via from the third capacitor and the fourth capacitor.

Figure 4:
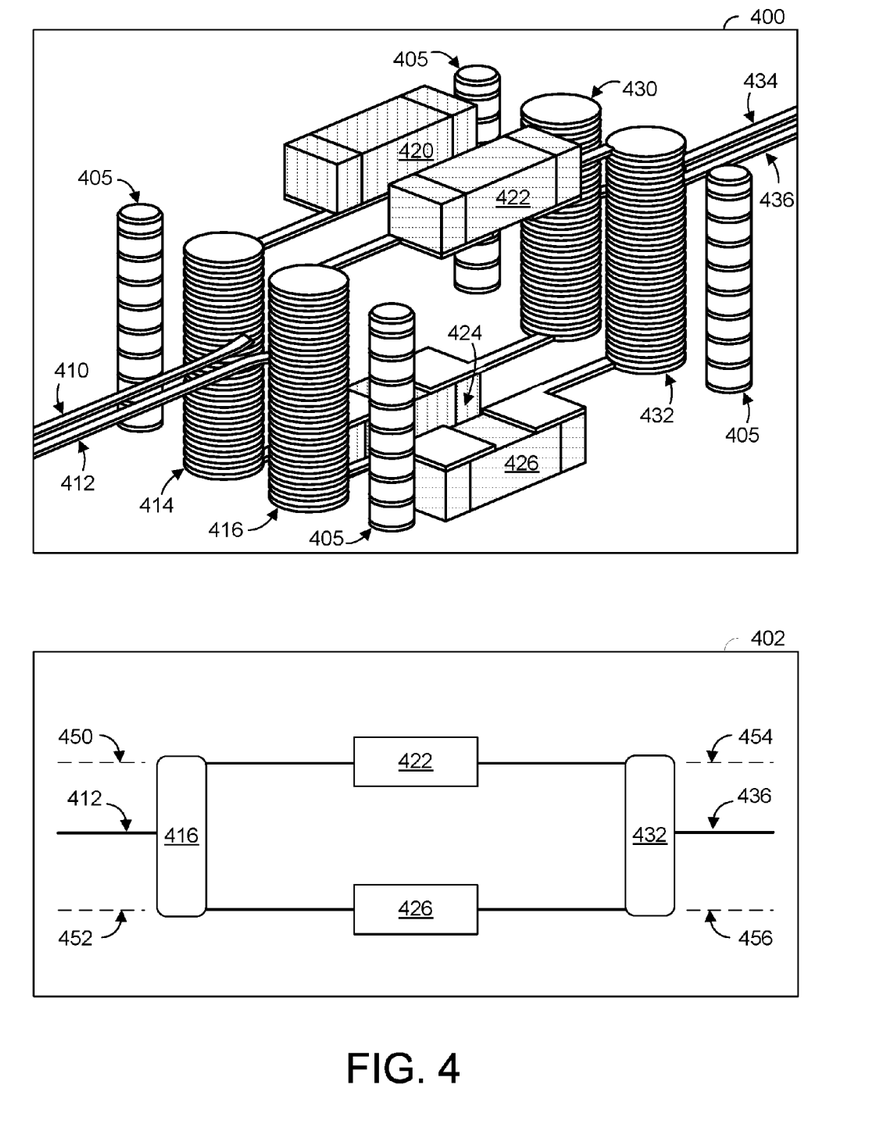
FIG. 4 is a perspective view of interconnect structures to facilitate differential signal communications according to an embodiment.

FIG. 4 illustrates elements of a device 400 to communicate differential signaling according to an embodiment. Device 400 may include some or all of the features of system 200, for example. In an embodiment, manufacture and/or operation of device 400 includes operations of method 300.

Device 400 may include circuit structures variously formed in or on a substrate such as a printed circuit board. Such interconnect structures may include vias 414, 416, 430, 432 that, for example, correspond functionally to V1, V2, V3, V4 of substrate 210. Although some embodiments are not limited in this regard, device 400 may include one or more additional interconnect structures, such as the illustrative vias 405 shown. In the embodiment shown in FIG. 4, vias 414, 416 are coupled to respective signal lines 410, 412 each to provide a respective signal of a differential signal pair. Portions of the signal provided by signal line 410 may be variously communicated from via 414 to respective ones of capacitors 420, 424 and subsequently to 430. Concurrently, portions of the signal provided by signal line 412 may be variously communicated from via 416 to respective ones of capacitors 422, 426 and then to via 432. Signal lines 434, 436 of device 400 may be coupled to communicate a modified version of the differential signal pair from vias 430, 432.

As illustrated by inset 402 of FIG. 4 some or all of signal lines 410, 412, 434, 436 may be variously disposed in one or more planes that extend through respective locations (e.g., including a location other than any via end portion) of vias 414, 416, 430, 432. By way of illustration and not limitation, signal line 412 may communicate a signal in a metallization layer that extends between and in parallel with planes 450, 452, and that includes a point of connection to via 416. Alternatively or in addition, signal line 436 may communicate a portion of such a signal in a metallization layer that extends between and in parallel with planes 454, 456, and that includes a point of connection to via 432. In one embodiment, signal line 412, 436 are at the same level of the substrate—e.g., wherein planes 450, 454 are both the same first plane and/or planes 452, 456 are both the same second plane. As a result, a first signal path from signal line 412 to signal line 436 via capacitor 422 may be substantially the same—e.g., within five percent—of a second signal path from signal line 412 to signal line 436 via capacitor 426.

Figure 5:
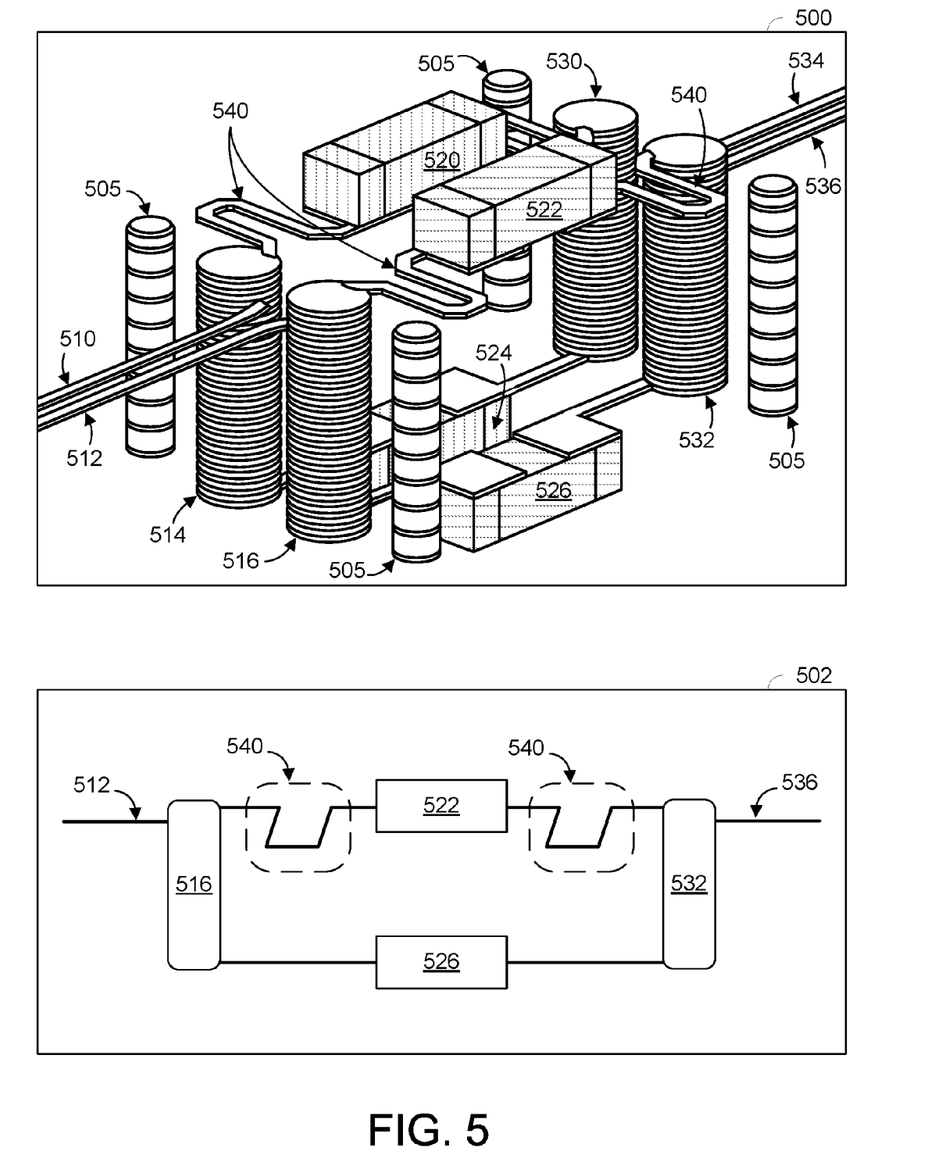
FIG. 5 is a perspective view of interconnect structures to facilitate differential signal communications according to an embodiment.

FIG. 5 illustrates elements of a device 500 to communicate differential signaling according to an embodiment. Device 500 may include some or all of the features of system 200, for example. In an embodiment, manufacture and/or operation of device 500 includes operations of method 300.

Device 500 may include circuit structures variously formed in or on a substrate such as a printed circuit board. Such interconnect structures may include vias 514, 516, 530, 532 that, for example, correspond functionally to V1, V2, V3, V4 of substrate 210. Although some embodiments are not limited in this regard, device 500 may include one or more additional interconnect structures, such as the illustrative vias 505 shown. In the embodiment shown in FIG. 5, vias 514, 516 are coupled to respective signal lines 510, 512 each to provide a respective signal of a differential signal pair. Portions of the signal provided by signal line 510 may be variously communicated from via 514 to respective ones of capacitors 520, 524 and subsequently to 530. Concurrently, portions of the signal provided by signal line 512 may be variously communicated from via 516 to respective ones of capacitors 522, 526 and then to via 532. Signal lines 534, 536 of device 500 may be coupled to communicate a modified version of the differential signal pair from vias 530, 532.

As illustrated by inset 502 of FIG. 5, different metallization layers in the substrate may include respective ones of signal lines 510, 512, 534, 536. By way of illustration and not limitation, signal line 512 may communicate a signal in a metallization layer that includes an end of via 516 (or that is otherwise closer to such an end than to a middle of via 516). Alternatively or in addition, signal line 536 may communicate a portion of such a signal in a metallization layer that includes an end of via 532 (or that is otherwise closer to such an end than to a middle of via 532). In one embodiment, signal line 512, 536 are at the same level of the substrate. As a result, a first signal path from signal line 512 to signal line 536 via capacitor 522 may be shorter than a second signal path from signal line 512 to signal line 536 via capacitor 526.

However, some embodiments avoid such signal path differences by including interconnect structures that provides for more equalized signal path lengths—e.g., by providing additional length to the first signal path from signal line 512 to signal line 536 via capacitor 522. For example, device 540 may include one or more conductive traces—e.g., such as the illustrative conductive traces 540, 540 shown—that are each coupled between one of capacitors 520, 522, 524, 526 and one of vias 514, 516, 530, 532. Some or all such conductive traces may each form a respective bend and/or curve structure (referred to herein as a "corrugation structure") that is to increase the overall length of a signal path between the corresponding capacitor and via. Such a corrugation structure may deviate from a straight line between respective points of connection to the capacitor and via. For example, a maximum distance of such deviation may be three times or more (e.g., at least five times) a smallest cross-sectional width of the conductive trace.

Figure 6:
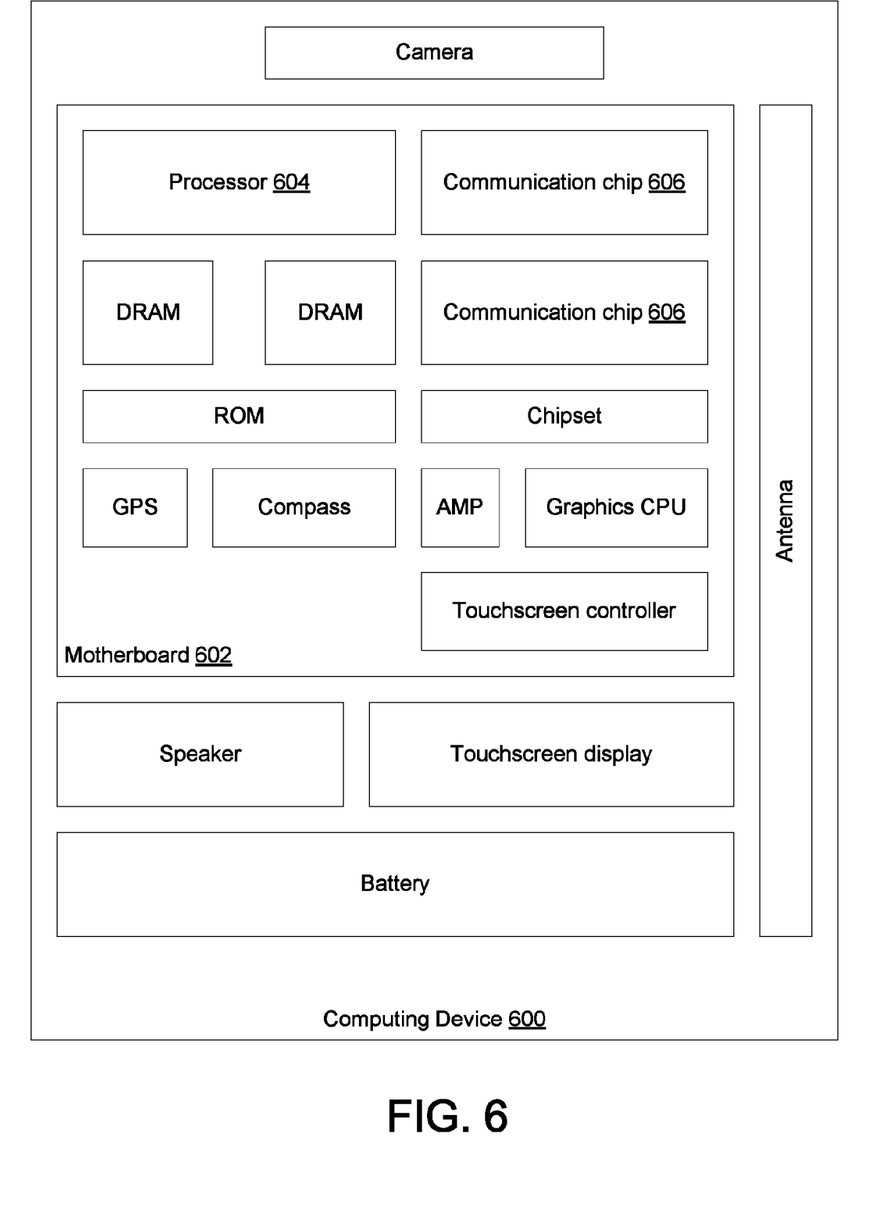
FIG. 6 is a functional block diagram illustrating elements of a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
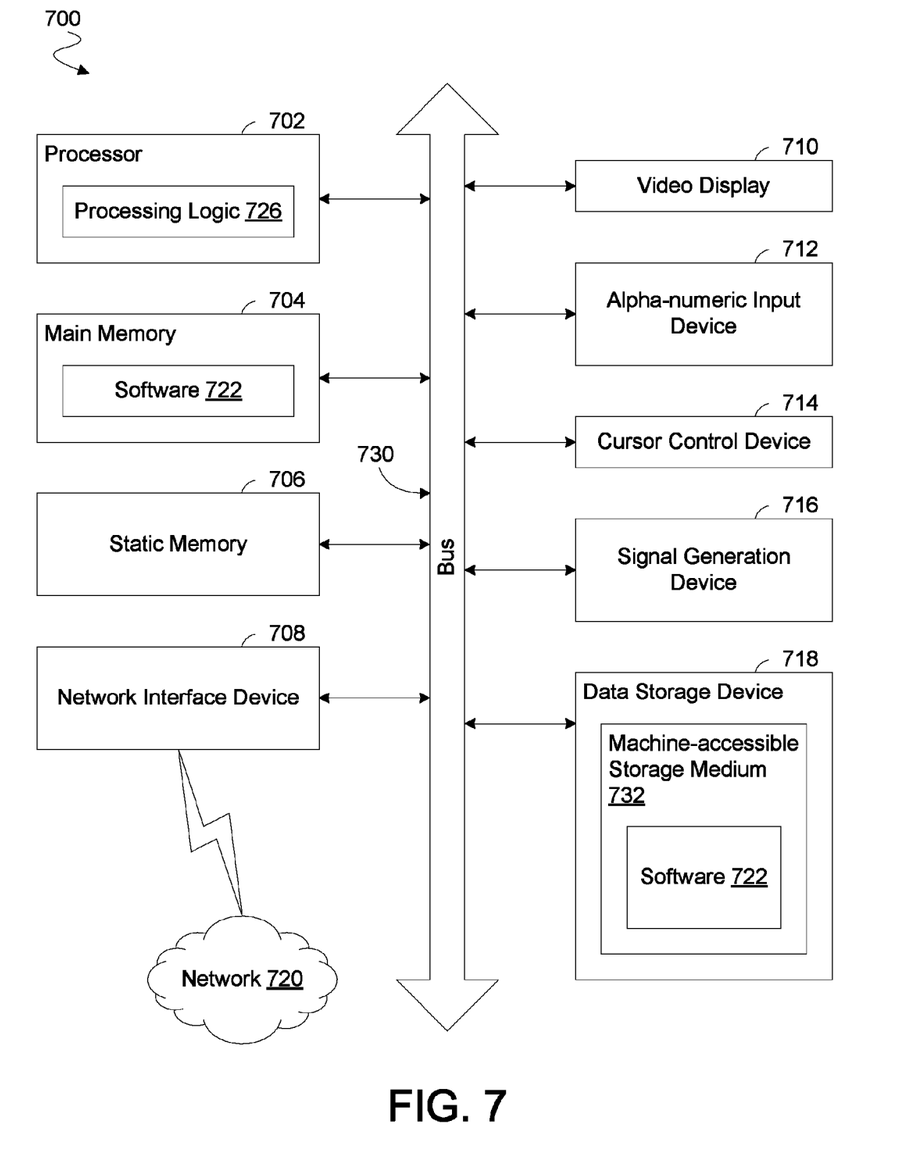
FIG. 7 is a functional block diagram illustrating elements of an exemplary computer system, in accordance with an embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a device comprises a substrate, a first via and a second via each extending in the substrate, the first via configured to receive a first signal, and a first capacitor and a second capacitor each disposed in or on the substrate, the first capacitor and the second capacitor coupled in parallel with each other between the first via and the second via, wherein the first capacitor and a second capacitor are coupled each to communicate a respective portion of the first signal from the first via to the second via. In one embodiment, the device further comprises a third via and a fourth via each extending in the substrate, the third via configured to receive a second signal, and a third capacitor and a fourth capacitor each disposed in or on the substrate, the third capacitor and the fourth capacitor coupled in parallel with each other between the third via and the fourth via, wherein the third capacitor and a fourth capacitor are coupled each to communicate a respective portion of the second signal from the third via to the fourth via.

In another embodiment, a differential signal pair includes the first signal and the second signal. In another embodiment, the first capacitor and the second capacitor are coupled to the first via by way of opposite respective ends of the first via. In another embodiment, the first capacitor and the second capacitor are coupled to the second via by way of opposite respective ends of the second via. In another embodiment, a printed circuit board includes the substrate. In another embodiment, a first conductive trace couples the first capacitor to one of the first via and the second via, wherein the first conductive trace forms a first corrugation structure. In another embodiment, a second conductive trace couples the second capacitor to one of the first via and the second via, wherein the second conductive trace forms a second corrugation structure.

In another embodiment, the device further comprises a third via and a fourth via each extending in the substrate, the third via configured to receive a second signal, and a third capacitor and a fourth capacitor each disposed in or on the substrate, the third capacitor and the fourth capacitor coupled in parallel with each other between the third via and the fourth via, wherein the third capacitor and a fourth capacitor are coupled each to communicate a respective portion of the second signal from the third via to the fourth via, wherein a second conductive trace couples the third capacitor to one of the third via and the fourth via, wherein the second conductive trace forms a second corrugation structure.

In another implementation, a method comprises receiving a first signal at a first via, wherein the first via and a second via each extend in a substrate, wherein a first capacitor and a second capacitor are coupled in parallel with each other between the first via and the second via, and with the first capacitor, communicating a first portion of the first signal from the first via to the second via, and with the second capacitor, communicating a second portion of the first signal from the first via to the second via, the first portion of the first signal concurrent with the second portion of the first signal.

In one embodiment, the method further comprises receiving a second signal at a third via, wherein the third via and a fourth via each extend in a substrate, wherein a third capacitor and a fourth capacitor are coupled in parallel with each other between the third via and the fourth via, and with the third capacitor, communicating a first portion of the second signal from the third via to the fourth via, and with the second capacitor, communicating a second portion of the second signal from the third via to the fourth via, the first portion of the second signal concurrent with the second portion of the second signal.

In another embodiment, a differential signal pair includes the first signal and the second signal. In another embodiment, the first capacitor and the second capacitor are coupled to the first via by way of opposite respective ends of the first via. In another embodiment, a printed circuit board includes the substrate. In another embodiment, a first conductive trace couples the first capacitor to one of the first via and the second via, wherein the first conductive trace forms a first corrugation structure. In another embodiment, a second conductive trace couples the second capacitor to one of the first via and the second via, wherein the second conductive trace forms a second corrugation structure.

In another implementation, a system comprises a substrate, a first via and a second via each extending in the substrate, the first via configured to receive a first signal, a first capacitor and a second capacitor each disposed in or on the substrate, the first capacitor and the second capacitor coupled in parallel with each other between the first via and the second via, wherein the first capacitor and a second capacitor are coupled each to communicate a respective portion of the first signal from the first via to the second via, and a display coupled to the substrate, the display to generate an image based on the first signal. In one embodiment, the system further comprises a third via and a fourth via each extending in the substrate, the third via configured to receive a second signal, and a third capacitor and a fourth capacitor each disposed in or on the substrate, the third capacitor and the fourth capacitor coupled in parallel with each other between the third via and the fourth via, wherein the third capacitor and a fourth capacitor are coupled each to communicate a respective portion of the second signal from the third via to the fourth via.

In another embodiment, a differential signal pair includes the first signal and the second signal. In another embodiment, the first capacitor and the second capacitor are coupled to the first via by way of opposite respective ends of the first via. In another embodiment, the first capacitor and the second capacitor are coupled to the second via by way of opposite respective ends of the second via. In another embodiment, a printed circuit board includes the substrate. In another embodiment, a first conductive trace couples the first capacitor to one of the first via and the second via, wherein the first conductive trace forms a first corrugation structure. In another embodiment, a second conductive trace couples the second capacitor to one of the first via and the second via, wherein the second conductive trace forms a second corrugation structure. In another embodiment, the system further comprises a third via and a fourth via each extending in the substrate, the third via configured to receive a second signal, and a third capacitor and a fourth capacitor each disposed in or on the substrate, the third capacitor and the fourth capacitor coupled in parallel with each other between the third via and the fourth via, wherein the third capacitor and a fourth capacitor are coupled each to communicate a respective portion of the second signal from the third via to the fourth via, wherein a second conductive trace couples the third capacitor to one of the third via and the fourth via, wherein the second conductive trace forms a second corrugation structure.

Techniques and architectures for facilitating differential communication are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
a substrate;
a first via and a second via each extending in the substrate, the first via configured to receive a first signal;
a first capacitor and a second capacitor each disposed in or on the substrate, the first capacitor and the second capacitor coupled in parallel with each other between the first via and the second via, wherein the first capacitor and a second capacitor are coupled each to communicate a respective portion of the first signal from the first via to the second via;
a third via and a fourth via each extending in the substrate, the third via configured to receive a second signal; and
a third capacitor and a fourth capacitor each disposed in or on the substrate, the third capacitor and the fourth capacitor coupled in parallel with each other between the third via and the fourth via, wherein the third capacitor and a fourth capacitor are coupled each to communicate a respective portion of the second signal from the third via to the fourth via,
wherein a differential signal pair includes the first signal and the second signal.

2. The device of claim 1, wherein the first capacitor and the second capacitor are coupled to the first via by way of opposite respective ends of the first via.

3. The device of claim 2, wherein the first capacitor and the second capacitor are coupled to the second via by way of opposite respective ends of the second via.

4. The device of claim 1, wherein a printed circuit board includes the substrate.

5. The device of claim 1, wherein a first conductive trace couples the first capacitor to one of the first via and the second via, wherein the first conductive trace forms a first corrugation structure.

6. The device of claim 5, wherein a second conductive trace couples the second capacitor to one of the first via and the second via, wherein the second conductive trace forms a second corrugation structure.

7. The device of claim 5, further comprising:
a third via and a fourth via each extending in the substrate, the third via configured to receive a second signal; and
a third capacitor and a fourth capacitor each disposed in or on the substrate, the third capacitor and the fourth capacitor coupled in parallel with each other between the third via and the fourth via, wherein the third capacitor and a fourth capacitor are coupled each to communicate a respective portion of the second signal from the third via to the fourth via, wherein a second conductive trace couples the third capacitor to one of the third via and the fourth via, wherein the second conductive trace forms a second corrugation structure.

8. A method comprising:
receiving a first signal at a first via, wherein the first via and a second via each extend in a substrate, wherein a first capacitor and a second capacitor are coupled in parallel with each other between the first via and the second via;
with the first capacitor, communicating a first portion of the first signal from the first via to the second via;
with the second capacitor, communicating a second portion of the first signal from the first via to the second via, the first portion of the first signal concurrent with the second portion of the first signal,
receiving a second signal at a third via, wherein the third via and a fourth via each extend in a substrate, wherein a third capacitor and a fourth capacitor are coupled in parallel with each other between the third via and the fourth via;
with the third capacitor, communicating a first portion of the second signal from the third via to the fourth via; and
with the fourth capacitor, communicating a second portion of the second signal from the third via to the fourth via, the first portion of the second signal concurrent with the second portion of the second signal,
wherein a differential signal pair includes the first signal and the second signal.

9. The method of claim 8, wherein the first capacitor and the second capacitor are coupled to the first via by way of opposite respective ends of the first via.

10. The method of claim 8, wherein a printed circuit board includes the substrate.

11. The method of claim 8, wherein a first conductive trace couples the first capacitor to one of the first via and the second via, wherein the first conductive trace forms a first corrugation structure.

12. The method of claim 11, wherein a second conductive trace couples the second capacitor to one of the first via and the second via, wherein the second conductive trace forms a second corrugation structure.

13. A system comprising:
a substrate;
a first via and a second via each extending in the substrate, the first via configured to receive a first signal;
a first capacitor and a second capacitor each disposed in or on the substrate, the first capacitor and the second capacitor coupled in parallel with each other between the first via and the second via, wherein the first capacitor and a second capacitor are coupled each to communicate a respective portion of the first signal from the first via to the second via;
a third via and a fourth via each extending in the substrate, the third via configured to receive a second signal; and
a third capacitor and a fourth capacitor each disposed in or on the substrate, the third capacitor and the fourth capacitor coupled in parallel with each other between the third via and the fourth via, wherein the third capacitor and a fourth capacitor are coupled each to communicate a respective portion of the second signal from the third via to the fourth via, wherein a differential signal pair includes the first signal and the second signal; and
a display coupled to the substrate, the display to generate an image based on the first signal.

14. The system of claim 13, wherein the first capacitor and the second capacitor are coupled to the first via by way of opposite respective ends of the first via.

15. The system of claim 14, wherein the first capacitor and the second capacitor are coupled to the second via by way of opposite respective ends of the second via.

* * * * *